United States Patent [19]

Griffin

[11] 4,116,516

[45] Sep. 26, 1978

[54] MULTIPLE LAYERED CONNECTOR

[75] Inventor: Wendell L. Griffin, Warren, Pa.

[73] Assignee: GTE Sylvania Incorporated, Stamford, Conn.

[21] Appl. No.: 809,927

[22] Filed: Jun. 24, 1977

[51] Int. Cl.² ............................................. H05K 1/07
[52] U.S. Cl. ............................... 339/17 F; 339/17 L; 339/75 MP
[58] Field of Search ................. 339/17 R, 17 E, 17 F, 339/17 L, 17 LM, 17 M, 176 MF, 176 MP, 75 MP

[56] References Cited
FOREIGN PATENT DOCUMENTS 880,585  10/1961  United Kingdom ............ 339/176 MF

OTHER PUBLICATIONS

IBM Tech. Discl. Bulletin, Shea, vol. 9, No. 2, Jul. 1966, p. 148.

Primary Examiner—Neil Abrams
Attorney, Agent, or Firm—Robert E. Walter

[57] ABSTRACT

A connector for a printed wiring board wherein a portion of a multiple layered cable extends into the connector housing and comprises a plurality of stepped layers each of which comprises a plurality of contacts. The end of the printed wiring board which is inserted into such connector also comprises a plurality of stepped layers each of which comprises a plurality of contacts. The stepped layers and rows of contacts of the connector mate with the stepped layers and rows of contacts of the printed wiring board to effect an electrical interface between the connector and board.

15 Claims, 4 Drawing Figures

U.S. Patent    Sept. 26, 1978    Sheet 1 of 3    4,116,516
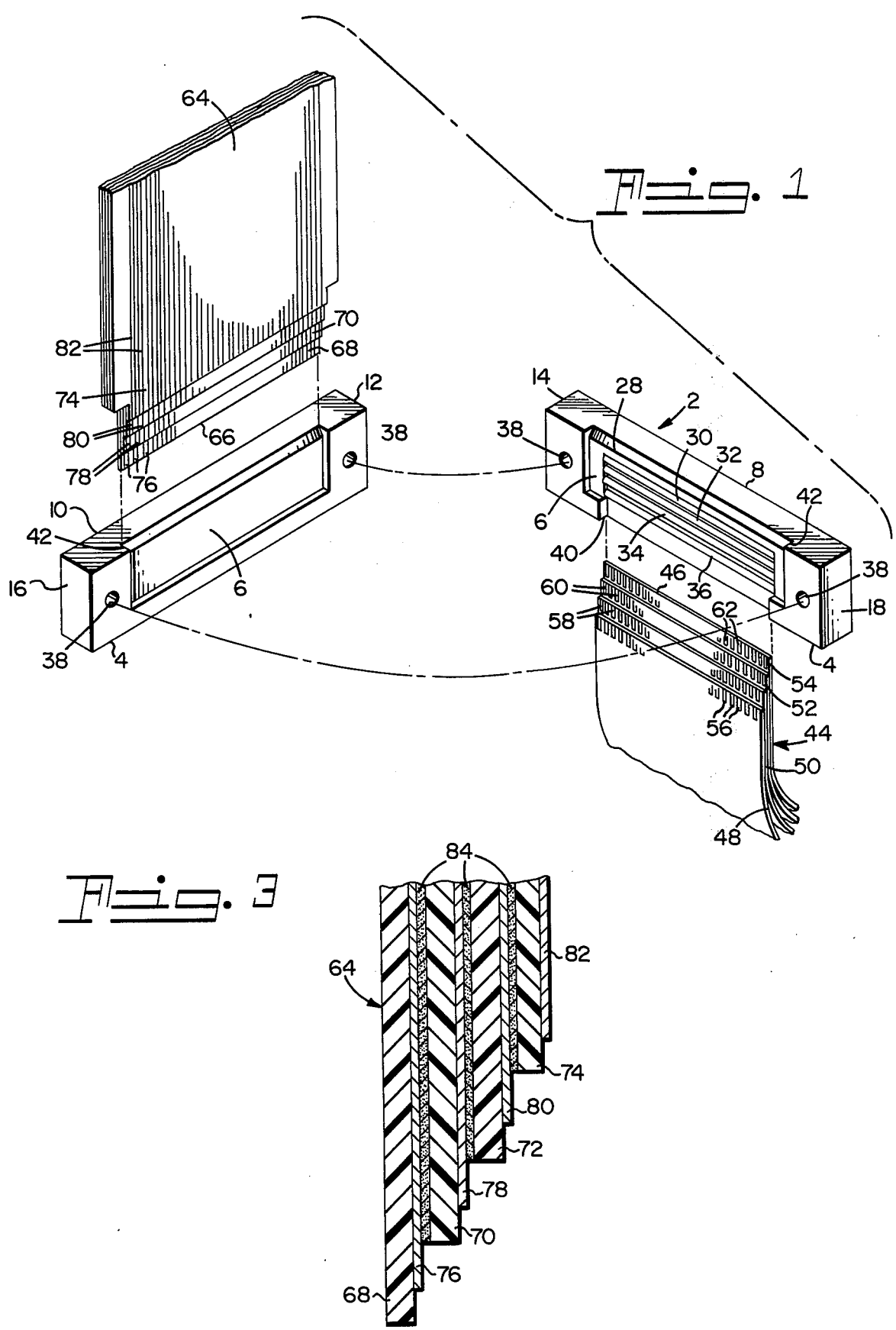

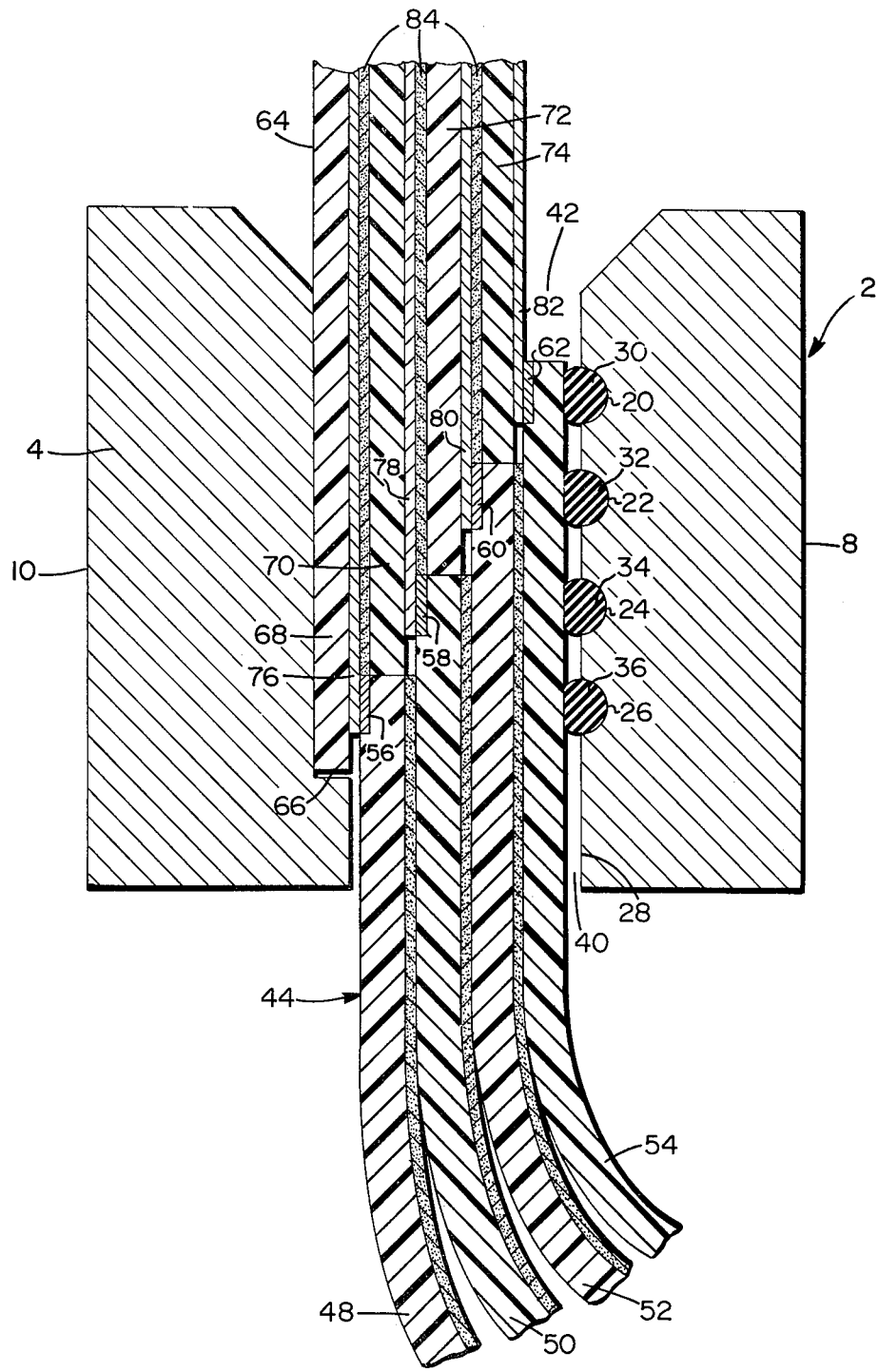

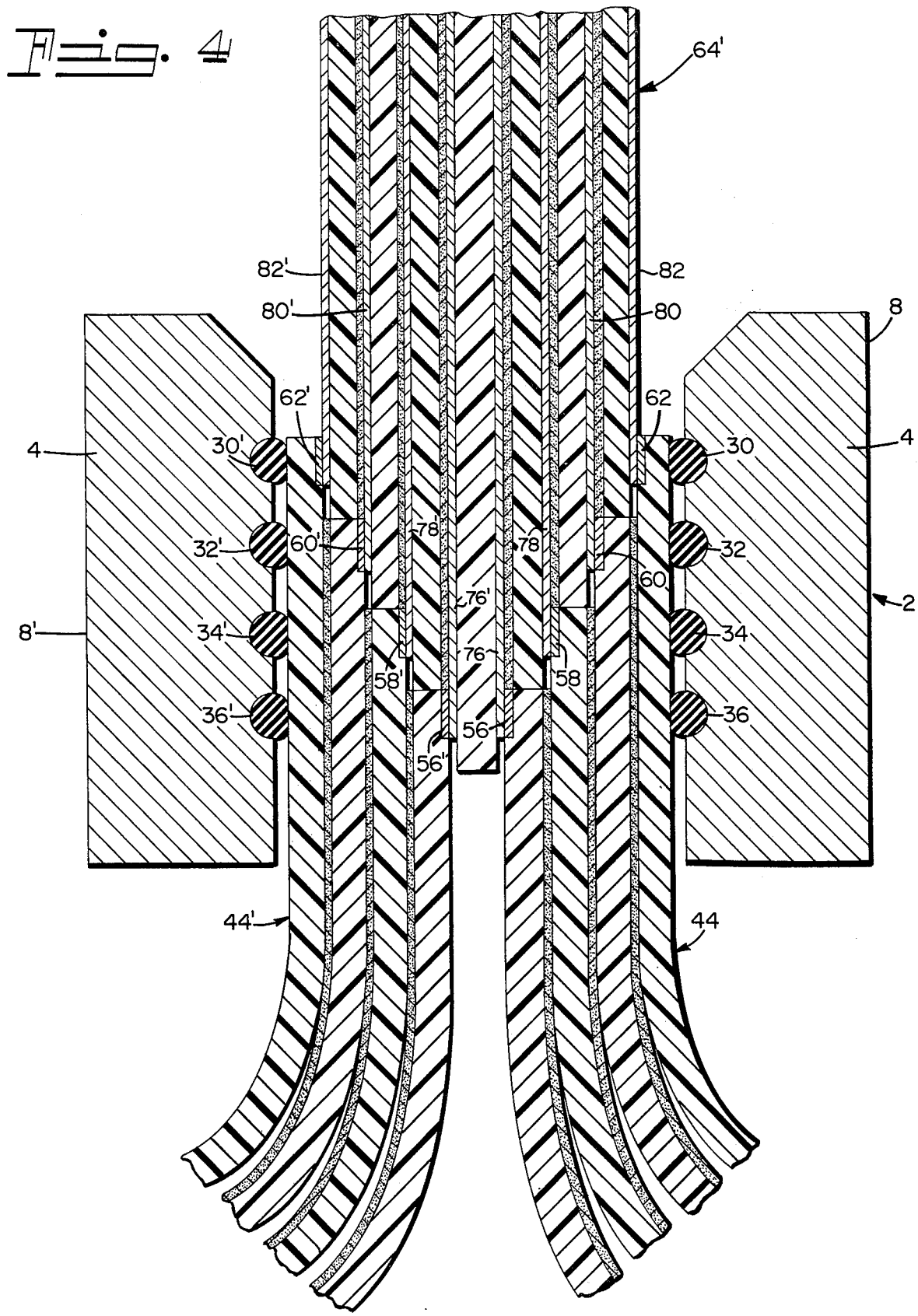

MULTIPLE LAYERED CONNECTOR

BACKGROUND OF THE INVENTION

1. Field of the Invention

The present invention relates to an electrical connector and, more particularly, to an electrical connector for use in flat multiple layer cable systems wherein the end portion of a multiple layer cable extends into a connector housing and comprises various stepped layers each of which includes a row of contact points. Similarly, the end portion of a multiple layer printed wiring board extends into the connector housing and comprises various stepped layers each of which includes a row of contacts or terminals. The stepped layers of the cable mate with the stepped layers of the board and are spring loaded by spring means which are provided inside of the connector housing for urging the connector contact points into electrical and physical engagement with the board terminals with which the contact points mate. Such an electrical connector is referred to herein as a multiple layered connector, and such a printed wiring board is referred to herein as a multiple layered printed wiring board. The connector assembly of this invention comprises the multiple layered printed wiring board inserted into the multiple layered connector.

2. Description of Prior Art

Prior art electrical connectors have been produced utilizing electrical contacts which are manufactured from a solid metallic strip or wire which has been subjected to several manufacturing operations. Not only are such operations costly but use of the contacts so produced involves various limitations in the connectors which comprise such contacts. For example, the usual configuration of such contacts places undesirable limitations upon the degree of contact density within the connector housing. This is true even regarding those connectors wherein contact density can be increased to some extent by a further reduction in contact spacing or contact size. In addition, in many applications the contacts must not only carry current but also must be produced from a resilient material so that the contacts can resile towards and engage printed wiring board terminals when in operation. Accordingly, in selecting a material for use as an electrical contact a compromise must be made in order to satisfy the requirements that the contact be resilient and conductive to the extent desired.

Prior art attempts have been made to increase contact density by utilizing multiple layered flat cable in electrical systems. However, heretofore multiple layered cable has not been particularly conducive for use with standard electrical connectors of the type wherein a multiple layered printed wiring board may be readily inserted into or removed from a receptacle formed by a connector body. For example, some attempts to utilize multiple layered flat cable in such applications where a plurality of closely spaced electrical contacts are required within a relatively small connector housing have involved complex interconnection between connector contacts and the various circuit layers of the cable. In such applications, plated holes are made in the cable at ninety degrees to the appropriate circuit layer. Subsequently, the tails or end portions of the connector contacts are inserted through such holes, and electrical continuity between the contacts and circuity is effected by means of solder or interface fits. Such complex interconnections undesirably limit contact density. In addition, the plated holes are expensive to produce.

It is therefore one of the objects of the present invention to provide a multiple layered connector for use in flat cable systems and into which may be readily inserted, or from which may be readily removed, a multiple layered printed wiring board.

Another object of the present invention is to provide a multiple layered connector wherein a plurality of closely spaced electrical contacts may be provided within a small connector housing.

A further object of the present invention is to provide a multiple layered connector having contacts manufactured from a conductive material selected independent of the material used to manufacture the spring means used to urge the contacts into electrical and physical engagement with the terminals of a printed wiring board inserted into the connector.

Yet a further object of the present invention is to provide a multiple layered connector having spring means, for urging connector contacts into electrical and physical engagement with the printed wiring board terminals, manufactured from a resilient material selected independent of the material used to manufacture the connector contacts.

Yet another object of the present invention is to provide a multiple layered connector which is simple in construction.

A further object of the present invention is to provide a multiple layered connector having electrical contacts which may be manufactured without requiring several of the operations heretofore considered necessary.

These and other objects will become apparent from the detailed discussion which follows and from the accompanying drawings.

SUMMARY OF THE INVENTION

Generally, the multiple layered electrical connector of the present invention comprises a hollow housing having two apertures therein. One end of a multiple layered cable extends through one of the apertures and into the housing. Said cable end comprises a first layer of contacts and at least one other layer of contacts stepped off from the first layer in such a manner that a cross section of the side of the cable end has a stepped configuration.

The printed wiring board used comprises a plurality of circuit layers. One end of the board extends through one of the apertures in the connector and into the housing. Said board end comprises a first layer of contacts and at least one other layer of contacts stepped off from the first layer in such a manner that a cross section of the side edge of the board end also has a stepped configuration. The stepped configuration of the board is of such a nature that when the board is inserted into the connector the multiple board layers and board contacts mate with, and form an inverse mirror image of, the multiple cable layers and cable contacts.

The connector further includes spring means internal thereof for urging the cable contacts into electrical and physical engagement with the board contacts of the printed wiring board inserted into the connector.

BRIEF DESCRIPTION OF THE DRAWINGS

In the drawings wherein like reference characters denote corresponding parts throughout the several views;

FIG. 1 is an exploded view of one embodiment of the connector of the present invention.

FIG. 2 is an end view in section of the connector of FIG. 1 when assembled.

FIG. 3 is an end view in section of the printed wiring board of FIG. 2.

FIG. 4 is an end view in section of another embodiment of the present invention.

DESCRIPTION OF THE PREFERRED EMBODIMENTS

FIGS. 1 and 2 depict one embodiment of the multiple layered connector of the present invention. The connector 2 comprises a hollow housing 4, the hollow portion 6 of which is formed by opposing side walls 8 and 10 connected by end walls 12, 14 and 16, 18. Housing 4 may be of an electrically insulative material, for example, plastic, or of an electrically conductive material, for example, metal. In the preferred embodiment the hollow portion 6 comprises grooves 20, 22, 24 and 26 in the interior wall 28 of side wall 8. Spring means 30, 32, 34 and 36 are positioned within grooves 20, 22, 24 and 26, respectively, and are preferably affixed to the interior wall 28 as, for example, by means of an adhesive. In the preferred embodiment, the spring means 30 to 36 are an elastomer such as, for example, silicone rubber. However, in accordance with the broader aspects of the invention, spring means 30 to 36 may be of an electrically conductive or other electrically insulative material. When connector 2 is assembled, side wall 8 is affixed to side wall 10 as, for example, by passing screws or bolts through apertures 38. Connector 2 includes apertures 40 and 42 into which a multiple layered cable 44 and multiple layered printed wiring board 64 may be inserted, respectively.

As depicted in the drawings, multiple layered cable 44 has one end 46 which extends through aperture 40 into the hollow portion 6 of housing 4. End 46 of cable 44 includes a plurality of layers of contacts, each layer being offset or stepped off from adjacent layers in such a manner that a cross section thereof, as depicted in FIG. 2, has a step-like configuration. For example, in FIGS. 1 and 2, cable 44 comprises stepped layers 48, 50, 52 and 54 each of which includes a row of contacts 56, 58, 60 and 62, respectively. When connector 2 is assembled said contacts are urged by spring means towards the printed wiring board 64 inserted into the connector, preferably such that cable contacts 56, 58, 60 and 62 are urged by spring means 36, 34, 32 and 30, respectively, towards the board contacts with which the cable contacts mate. In accordance with the broader aspects of the invention, it is understood that cable 44 can include only two layers each of which includes only one contact, if desired, although preferably, whether cable 44 includes two, three, four or more layers, each layer includes a plurality or row of contacts.

Multiple layered printed wiring board 64 has one end 66 which extends through aperture 42 into the hollow portion 6 of housing 4. End 66 of board 64 includes a plurality of layers of contacts, each layer being offset or stepped off from adjacent layers in such a manner that a cross section thereof, as depicted in FIG. 2, has a step-like configuration, and the contacts thereof mate with the connector contacts. For example, board 64 comprises stepped layers 68, 70, 72 and 74 each of which includes a row of contacts 76, 78, 80 and 82, respectively. When connector 2 is assembled and board 64 has been inserted into aperture 42, board contacts 76, 78, 80 and 82 engage connector contacts 56, 58, 60 and 62, respectively. Whether board 64 is inserted into aperture 42 after connector 4 is assembled, or during the assembling thereof, in operation spring means 36, 34, 32 and 30 urge connector contacts 56, 58, 60 and 62, respectively, into physical and electrical engagement with board contacts 76, 78, 80 and 82, respectively.

As noted herein, cable 44 is a multiple layered cable the end 46 of which is stepped to the extent that the constituent layers are offset relative to adjacent layers. Preferably cable 44 comprises standard laminated flat cables as to each of which a conductor of plated copper is laminated on a plastic insulative substrate. The laminated layers are then bonded together to provide the multiple layered cable construction. Preferably, conductor contacts are provided, as desired, by removing the plastic insulative material from one side of the cable at one end thereof to expose the conductive copper material. In the example depicted in FIGS. 1 and 2, the plastic insulative material has been removed from one side of each of layers 48 to 54 at end 46 to expose the copper conductor and thereby provide rows of connector contacts 56, 58, 60 and 62. In the preferred embodiment, the contacts 56 to 62 may be further refined to enhance the electrical conductive properties thereof by securing to the contact surface additional metal(s). For example, a noble metal such as gold or silver, or nickel, may be secured to the contact surface as by welding, plating or similar operations.

Of course, it is not meant to limit the present invention to the laminated cable or plated contacts described above. For example, the contact system may be fabricated utilizing well known photo-etching techniques.

Also as noted herein, printed wiring board 64 is a multiple layered board having an edge or end 66 which is stepped to the extent that the constituent layers are offset relative to adjacent layers. The various laminated layers may be bonded together such that the conductive board contacts (also referred to herein as terminals or fingers) of each layer of the printed wiring board are exposed in successive parallel rows which mate with corresponding successive parallel rows of connector contacts as described herein. Preferably, and referring particularly to FIG. 3, printed wiring board 64 comprises a plurality of insulative plastic layers 68, 70, 72 and 74 as to each of which conductive board contacts or fingers 76, 78, 80 and 82 are laminated. The laminated layers are bonded together by means of a bonding agent, for example, a thermal adhesive 84. Examples of the materials which may be used to fabricate the conductive board contacts include precious metals, plated tin-lead or plated copper.

In accordance with one embodiment of the invention a multiple layered printed wiring board 64 is produced having four stepped layers each of which includes a row having 37 board contacts or fingers. Simiarly, the mating connector has four stepped layers each of which includes a row having 37 connector or cable contacts for a total of 148 electrical contacts. The board and connector contacts are spaced 0.050 inch center-to-center and have surfaces which are 0.025 inch in width. The conductive material used in the connector cable comprises a copper base to which is laminated contact areas of nickel having an average thickness of 0.000050 inch and which is gold-plated to a thickness of 0.000018 inch. The cable insulative material is polyester, and the spring means are produced from cylindrical silicone rubber having a diameter of 0.062 inch, a hardness factor of 70 durometer, and which is stabile at −62° C. to +232.2° C.

All of the foregoing specific dimensions and materials are by way of example, not of limitation, and are included herein to describe one embodiment of the invention.

In an alternative embodiment schematically depicted in FIG. 4, the connector 2 comprises a hollow housing 4 wherein side wall 10 of FIGS. 1 and 2 is replaced with a duplicate side wall 8' of the same construction as side wall 8. By providing multiple layered cable 44 and a similar multiple layered cable 44', a two-sided printed wiring board 64' may be utilized wherein contacts may be effected, in addition to those depicted in FIGS. 1 and 2, on the opposite side of printed wiring board 64'; that is, stepped connector contacts 56', 58', 60' and 62' may be urged into electrical and physical engagement with stepped board contacts 76', 78', 80' and 82', respectively, by means of spring means 36', 34', 32' and 30', respectively. Alternatively, the two sided printed wiring board of FIG. 4 may be used with the connector of FIGS. 1 and 2, or the connector of FIG. 4 can be used with the one-sided printed wiring board of FIGS. 1 and 2, if desired.

Thus, there has been shown and described a multiple layered connector which achieves the several objects set forth herein.

The embodiment which has been described herein is but one of several which utilize this invention and is set forth here by way of illustration but not of limitation. It is apparent that many other embodiments which will be readily apparent to those skilled in the art may be made without departing materially from the spirit and scope of this invention.

I claim:

1. A connector assembly, comprising in combination:
   a connector comprising a hollow housing including a first and second aperture and an internal hollow portion formed by first and second opposing side walls, at least one multiple layered cable having one end which extends through said first aperture and into said housing, one layer of said cable end including at least one cable contact, and at least one other layer at said cable end offset from said one layer and including at least one other cable contact,
   a multiple layered printed wiring board having one edge which extends through said second aperture and into said housing, one layer of said board at said edge including at least one board contact, and at least one other layer at said edge offset from said one board layer and including at least one other board contact, said board layers and board contacts mating with and forming an inverse mirror image of said cable layers and cable contacts, and
   said edge connector further including a plurality of spring means internal of said housing for urging said cable contacts into electrical and physical engagement with said board contacts, said plurality of spring means are juxtaposed between one wall and said cable with each spring means affixed to said wall internal of said housing.

2. The device of claim 1 wherein each of said cable layers include a plurality of contacts and each of said board layers include a plurality of mating contacts.

3. The device of claim 1 wherein said one wall comprises at least one groove therein and said spring means is positioned within said groove.

4. The device of claim 3 wherein said one wall comprises a plurality of grooves therein and spring means are positioned in each of said grooves.

5. The device of claim 4 wherein said spring means includes a cylindrical elastomer.

6. The device of claim 1 wherein said board is a two-sided printed wiring board, both sides of said board at said edge including at least one layer having at least one board contact, and at least one other layer offset therefrom and including at least one other board contact.

7. The device of claim 6 wherein said connector includes an additional multiple layered cable having one end which also extends through said first aperture and into said housing, one layer of said additional cable end including at least one cable contact, and at least one other layer at said additional cable end offset from said one layer and including at least one other cable contact, said two-sided printing wiring board extending through said second aperture, into said housing, and juxtaposed between said cable end and said additional cable end, and said board layers and board contacts on each side of said two-sided printed wiring board mating with and forming an inverse mirror image of adjacent cable layers and cable contacts.

8. The device of claim 7 wherein said housing includes an internal hollow portion formed by first and second opposing side walls, and said spring means is affixed to both of said walls internal of said housing, said spring means affixed to said first wall being juxtaposed between said first wall and said cable end, and said spring means affixed to said second wall being juxtaposed between said second wall and said additional cable end.

9. The device of claim 1 wherein said connector includes an additional multiple layered cable having one end which also extends into said housing, one layer of said additonal cable end including at least one cable contact, and at least one other layer at said additional cable end offset from said one layer and including at least one other cable contact.

10. The device of claim 9 wherein said housing includes an internal hollow portion formed by first and second opposing side walls, and said spring means is affixed to both of said walls internal of said housing, said spring means affixed to said first wall being juxtaposed between said first wall and said cable end, and said spring means affixed to said second wall being juxtaposed between said second wall and said additional cable end.

11. A connector for a multiple layered printed wiring board, comprising:
   a hollow housing formed by first and second opposing side walls and including a first aperture, at least one multiple layered cable having one end which extends through said first aperture and into said housing, one layer of said cable end including at least one cable contact, and at least one other layer at said cable end offset from said one layer and including at least one other cable contact,
   a second aperture for said printed wiring board, and
   a plurality of spring means internal of said housing for urging said cable contacts into electrical and physical engagement with said printed wiring board, said plurality of spring means are juxtaposed between one wall and said cable with each spring means affixed to said wall internal of said housing.

12. The device of claim 11 wherein each of said cable layers include a plurality of contacts.

13. The device of claim 11 wherein said one wall comprises at least one groove therein and said spring means is positioned within said groove.

14. The device of claim 13 wherein said one wall comprises a plurality of grooves therein and spring means are positoned in each of said grooves.

15. The device of claim 14 wherein said spring means includes a cylindrical elastomer.